(12) United States Patent
Oh et al.

(10) Patent No.: US 8,802,335 B2
(45) Date of Patent: Aug. 12, 2014

(54) EXTREME ULTRA VIOLET (EUV) MASK

(71) Applicant: SK hynix Inc., Icheon-si (KR)

(72) Inventors: Sung Hyun Oh, Cheongju-si (KR); Yoon Suk Hyun, Yongin-si (KR)

(73) Assignee: SK Hynix Inc., Icheon (KR)

( * ) Notice: Subject to any disclaimer, the term of this patent is extended or adjusted under 35 U.S.C. 154(b) by 72 days.

(21) Appl. No.: 13/682,657

(22) Filed: Nov. 20, 2012

(65) Prior Publication Data

US 2013/0189608 A1 Jul. 25, 2013

(30) Foreign Application Priority Data

Jan. 20, 2012 (KR) .................. 10-2012-0006829

(51) Int. Cl.
*G03F 1/22* (2012.01)
*G03F 1/24* (2012.01)

(52) U.S. Cl.
USPC .............................................. 430/5

(58) Field of Classification Search
USPC .......................................... 430/5, 30; 378/35
See application file for complete search history.

(56) References Cited

U.S. PATENT DOCUMENTS

2013/0029253 A1* 1/2013 Mangat et al. ................. 430/5
2013/0157177 A1* 6/2013 Yu et al. ......................... 430/5

* cited by examiner

*Primary Examiner* — Stephen Rosasco

(57) ABSTRACT

An extreme ultra violet (EUV) mask is disclosed, which prevents defects from shot overlap encountered in wafer exposure as well as reflection of unnecessary EUV and DUV generated in a black border region, such that a pattern CD is reduced and defects are not created. The EUV mask includes a quartz substrate, a multi-layered reflection film formed over the quartz substrate to reflect exposure light, an absorption layer formed over the multi-layered reflection film, a black border region formed over the quartz substrate that does not include the multi-layered reflection film, and a blind layer formed in a position including at least one of over the absorption layer, over the quartz substrate, and below the quartz substrate.

20 Claims, 10 Drawing Sheets

US 8,802,335 B2

EXTREME ULTRA VIOLET (EUV) MASK

CROSS-REFERENCE TO RELATED APPLICATION

The present application claims priority to Korean patent application No. 10-2012-0006829 filed on 20 Jan. 2012, which is incorporated by reference in its entirety.

BACKGROUND OF THE INVENTION

Embodiments of the present invention relate to an extreme ultra violet (EUV) mask, and more particularly to an EUV mask for use in an EUV process to reflect a light.

As semiconductor devices are gradually reduced in size, many techniques have been developed in semiconductor fabrication technology to facilitate size reduction. Exposure process technology in particular has been greatly changed. Specifically, existing immersion technology for use in memory devices of 40 nm or less has reached limits, so many developers and companies are conducting intensive research into EUV lithography.

Unlike a conventional exposure process, EUV exposure is carried out using a light source having a very short wavelength of 13.5 nm, such that the EUV exposure technology is the most important fabrication technology in developing semiconductor devices having a critical dimension (CD) of 40 nm or less. However, since EUV exposure uses a light source producing light with a very short wavelength relative to existing exposure sources, it uses a reflection mask instead of a conventional transmission mask.

Specifically, the critical dimension (CD) of features on a semiconductor may be reduced so that they are smaller than an intended size, and features may generally be damaged by EUV and DUV (Deep Ultra Violet; 193 nm~257 nm) light reflected from a black border region overlapped with an exposure region within one wafer.

BRIEF SUMMARY OF THE INVENTION

Various embodiments of the present invention are directed to providing an extreme ultra violet (EUV) mask that substantially obviates one or more problems due to limitations and disadvantages of the related art. Embodiments of the present invention relate to an EUV mask for preventing defects associated with shot overlap encountered in wafer exposure. Embodiments may also relate to reducing reflection of unnecessary EUV and DUV generated in a black border region.

In accordance with an aspect of the present invention, an extreme ultra violet (EUV) mask includes a quartz substrate; a black border region formed over the quartz substrate in a shot overlap area; a multi-layered reflection film formed over the quartz substrate so that a portion of the black border region is exposed; an absorption layer formed over the multi-layered reflection film; and a first blind layer formed over the absorption layer.

The blind layer includes a nitride film.

The blind layer includes at least one of a silicon oxide nitride (SiON) film, a tantalum boron oxynitride (TaBON) film, and a chromium oxynitride (CrON) film.

The absorption layer includes at least one of chromium (Cr), chromium nitride (CrN), tantalum boron nitride (TaBN), low-reflectivity TaBN (LR-TaBN), and tantalum nitride (TaN).

The multi-layered reflection film includes molybdenum (Mo) and silicon (Si).

The multi-layered reflection film is formed by alternately depositing at least 40 molybdenum (Mo) films and at least 40 silicon (Si) films.

The EUV mask further includes a capping layer located between the absorption layer and the multi-layered reflection film, the capping layer including at least one of a silicon oxide ($SiO_2$) film, a silicon (Si) film, or a ruthenium (Ru) film.

The EUV mask further includes a buffer layer formed over the capping layer, configured to include a silicon oxide ($SiO_2$) film or a chromium nitride (CrN) film.

The EUV mask further includes a second blind layer disposed over the quartz substrate and under the multi-layered reflection film.

The EUV mask further includes a third blind layer disposed under the quartz substrate.

In accordance with another aspect of the present invention, an extreme ultra violet (EUV) mask includes a quartz substrate; a black border region formed over the quartz substrate in a shot overlap area; a multi-layered reflection film formed over the quartz substrate so that a portion of the black border region is exposed; an absorption layer formed over the multi-layered reflection film; and a second blind layer formed over the quartz substrate and under the multi-layered reflection film.

The EUV mask further includes a third blind layer disposed under the multi-layered reflection film.

The blind layer includes at least one of a silicon oxide nitride (SiON) film, a tantalum boron oxynitride (TaBON) film, and a chromium oxynitride (CrON) film.

The EUV mask further includes a coating film disposed under the a second blind layer.

The EUV mask further includes a capping layer disposed over the multi-layer reflection film, and a buffer layer disposed over the capping layer.

In accordance with another aspect of the present invention, an extreme ultra violet (EUV) mask includes a quartz substrate; a black border region formed over the quartz substrate in a shot overlap area; a multi-layered reflection film formed over the quartz substrate so that a portion of the black border region is exposed; an absorption layer formed over the multi-layered reflection film; and a third blind layer formed below the quartz substrate.

The EUV mask further includes a first blind layer formed over the absorption layer.

The blind layer includes at least one of a silicon oxide nitride (SiON) film, a tantalum boron oxynitride (TaBON) film, and a chromium oxynitride (CrON) film.

The EUV mask further includes a coating film disposed under the quartz substrate.

The EUV mask further includes a capping layer disposed over the multi-layer reflection film, and a buffer layer disposed over the capping layer.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts. An EUV mask according to embodiments of the present invention will hereinafter be described with reference to the accompanying drawings.

Figure 1:
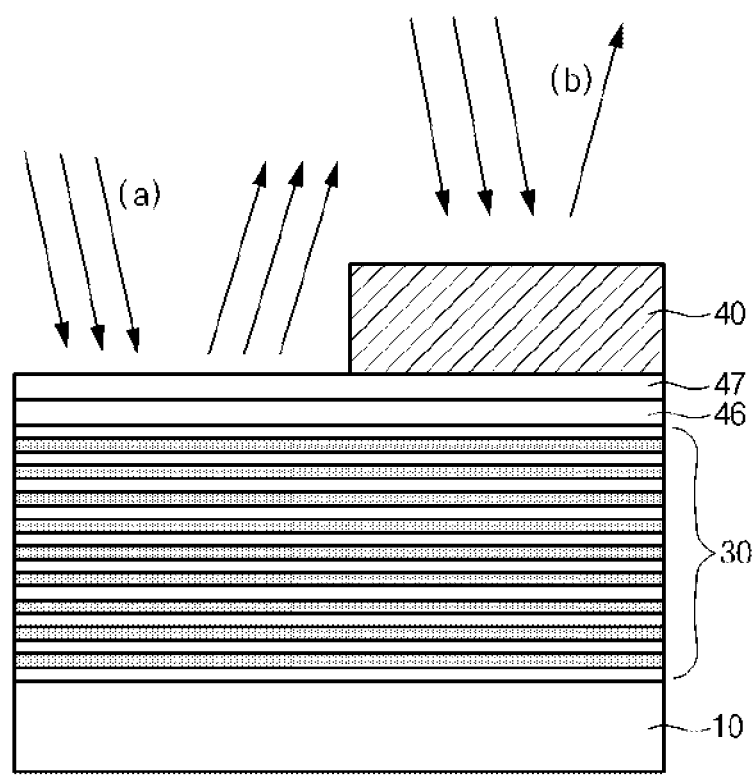
FIG. 1 is a cross-sectional view illustrating an EUV mask according to the present invention.

FIG. 1 is a cross-sectional view illustrating an EUV mask according to an embodiment of the present invention. Referring to FIG. 1, an EUV mask according to the present invention includes a multi-layered reflection film 30 formed over a quartz substrate 10, and a specific-patterned absorption layer 40 formed over the multi-layered reflection film 30.

Preferably, the multi-layered reflection film 30 may be formed by sequentially depositing molybdenum (Mo) and silicon (Si). The absorption layer 40 may include a material capable of absorbing EUV light and DUV light. For example, the absorption layer 40 may include chromium (Cr), chromium nitride (CrN), tantalum boron nitride (TaBN), tantalum nitride (TaN), low-reflectivity TaBN (LR-TaBN), or the like, and may be formed by an ion beam deposition (IBD) or atomic layer deposition (ALD) process. A capping layer 46 for protecting multi-layered reflection film 30 may be further formed below the absorption layer 40. In more detail, the capping layer 46 including a material such as silicon oxide ($SiO_2$), silicon (Si), or ruthenium (Ru) may be formed between the absorption layer 40 and the multi-layered reflection film 30, thereby protecting the multi-layered reflection film 30. A buffer layer 47 including a material such as $SiO_2$ or chromium nitride (CrN) may also be formed over the capping layer 46 (i.e., formed between the capping layer 46 and the absorption layer 40).

Referring to the EUV mask of FIG. 1, EUV and DUV emitted from the exposure light source, which are represented by arrows, are reflected from the multi-layered reflection film 30, as can be seen from (a), and most of the emitted light is absorbed in the absorption layer 40. However, as can be seen from (b) of the figure, another portion of the emitted light may sometimes be reflected even from the absorption layer 40.

Figure 2:
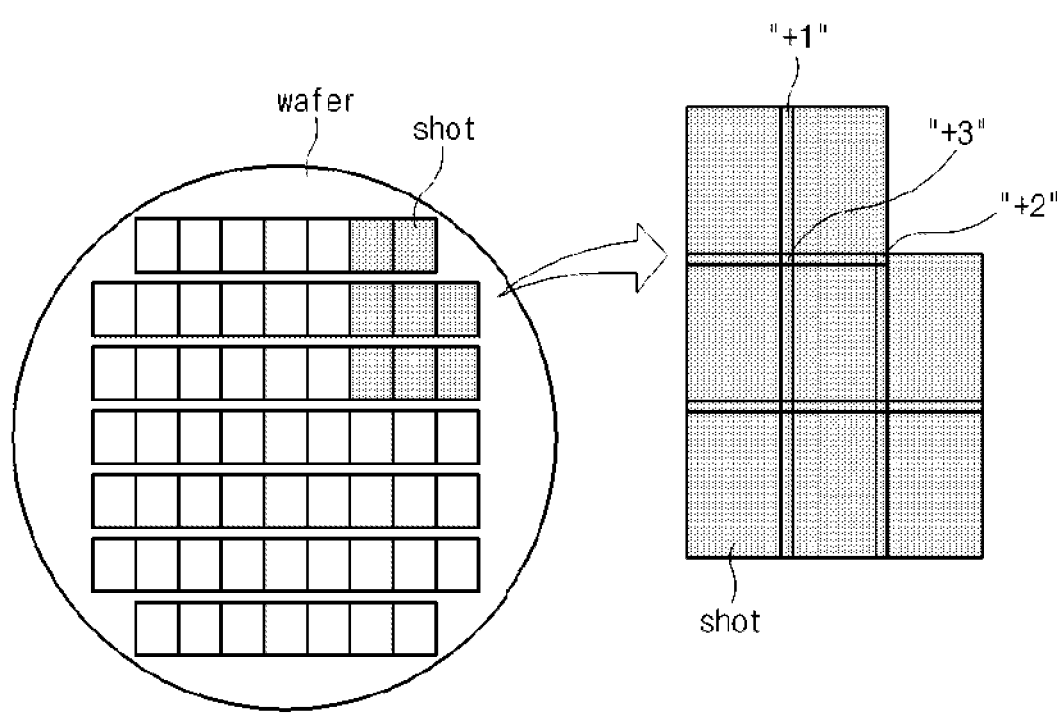
FIG. 2 shows a shot overlap phenomenon generated in wafer exposure.

FIG. 2 shows examples of how a shot overlap phenomenon occurs during a wafer exposure process. Referring to FIG. 2, when exposing a wafer, several discrete "shots" are taken to expose the majority of a wafer's surface. In the process of aligning the shots, borders of the shots are overlapped to avoid creating an unexposed surface. \The specific region where shots overlap is referred to herein as a black border region, a light shielding area, or a border area. For convenience of description, the specific region will hereinafter be referred to as a black border region. Referring to the right part of FIG. 2, the black border region may include a first region ('+1') in which two exposures are overlapped, a second region ('+2') in which three exposures are overlapped, and a third region ('+3') in which four exposures are overlapped. In these regions ('+1', '+2', '+3'), a higher-intensity exposure than the predetermined-intensity used for the bulk of the exposure process is carried out, which can result in the occurrence of a defective pattern.

Figure 3:
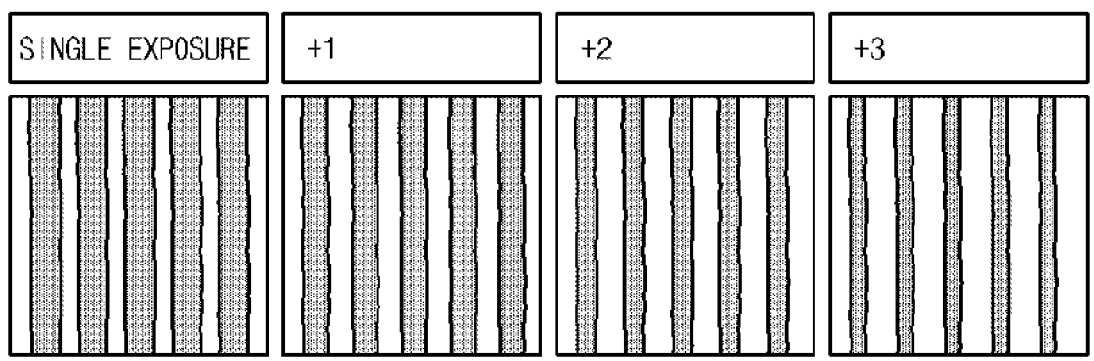
FIG. 3 is an image illustrating wafer CD variation caused by the shot overlap phenomenon shown in FIG. 2.

FIG. 3 is an image illustrating CD variation on a wafer caused by the shot overlap phenomenon shown in FIG. 2.

Referring to FIG. 3, a pattern CD of the first, second or third region ('+1', '+2', '+3') is smaller than that of a pattern CD formed by a single exposure (column labeled 'Single exposure' in FIG. 3). Although not shown in FIG. 3, if the pattern CD becomes smaller than a target CD, additional problems such as leaning of the pattern may occur. FIGS. 4 to 6, 8 to 10 are cross-sectional views of exemplary EUV masks according to embodiments of the present invention. Embodiments of the EUV mask according to the present invention will hereinafter be described with reference to FIGS. 4 to 6 and 8 to 10.

Figure 4:
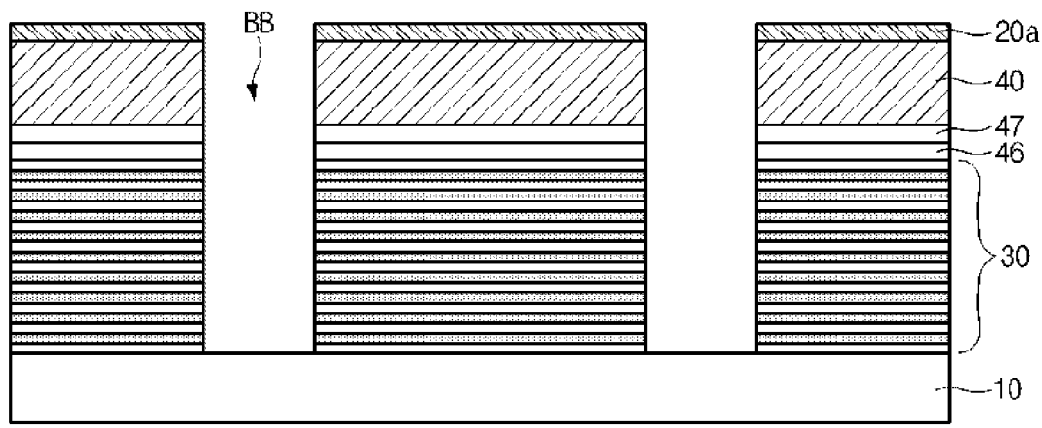
FIGS. 4 to 6, 8 to 10 are cross-sectional views of exemplary EUV masks according to embodiments of the present invention.

Referring to FIG. 4, a multi-layered reflection film 30 is formed over a quartz ($SiO_2$) substrate 10, and an absorption layer 40 is formed over the multi-layered reflection film 30. Although FIG. 4 shows the absorption layer 40 formed over the entire surface of the multi-layered reflection film 30, it should be noted that the actual absorption layer 40 may include a specific pattern shape to be formed. In the embodiment shown in FIG. 4, the multi-layered reflection film 30 is not formed over the quartz substrate 10 in a specific region. This specific region is referred to as a black border region, which is labeled "BB" on the figure.

A blind layer 20a is formed over the absorption layer 40 located outside of the BB region of the quartz substrate 10. The blind layer 20a may include a nitride film based material, such as at least one of a silicon oxide nitride (SiON) film, a tantalum boron oxynitride (TaBON) film, and a chromium oxynitride (CrON) film. As described above, if the blind layer 20a is further formed over the absorption layer 40 including chromium (Cr), the absorption rate can be increased. According to the experimental results from experiments performed with an embodiment of the present invention, the reflection rate of DUV can be reduced to near zero by the absorption layer 40 including the blind layer 20a. However, EUV reflectivity of about 0.2% remains.

In addition, as shown in FIG. 4, embodiments of the EUV mask may share the following characteristics ①, ②, ③ and ④ of with the EUV mask shown in FIG. 1. According to the first characteristic ①, molybdenum (Mo) and silicon (Si) are sequentially deposited in the multi-layered reflection film 30. According to the second characteristic ②, the absorption layer 40 may include, for example, chromium (Cr), chromium nitride (CrN), tantalum boron nitride (TaBN), low-reflectivity TaBN (LR-TaBN), tantalum nitride (TaN), etc. as a material capable of absorbing EUV light and DUV light, and may be formed by an ion beam deposition (IBD) or atomic layer deposition (ALD) process. According to the third characteristic ③, the capping layer 46 including a material such as silicon oxide ($SiO_2$), silicon (Si), or ruthenium (Ru) may be formed between the absorption layer 40 and the multi-layered reflection film 30. According to the fourth characteristic ④, the buffer layer 47 including a material such as silicon oxide ($SiO_2$) or chromium nitride (CrN) may also be formed over the capping layer 46 (i.e., formed between the capping layer 46 and the absorption layer 40). The above-mentioned characteristics ①~④ may also be applied to the embodiments shown in FIGS. 5 and 6, and as such a detailed description thereof will be omitted herein for convenience of description.

Figure 5:
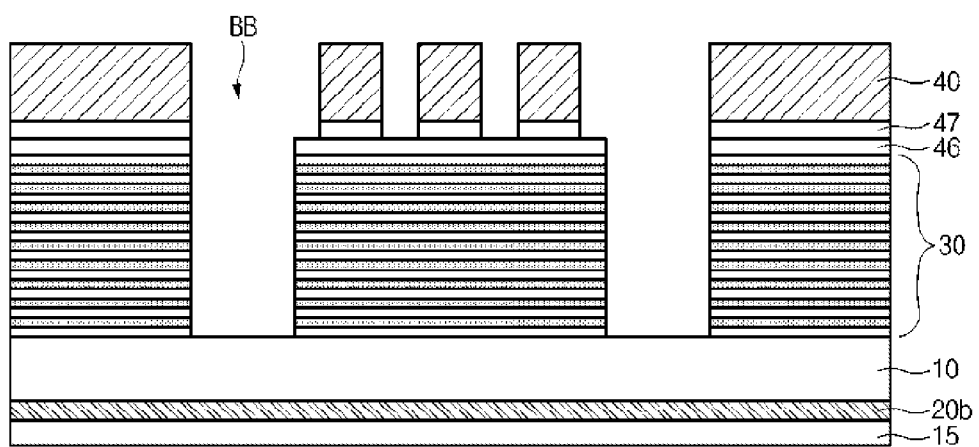

As described above, the quartz substrate 10, the multi-layered reflection film 30, and the absorption layer 40 shown in FIG. 5 share several characteristics with the embodiment of FIG. 4. The absorption layer 40 configured in the form of a specific pattern is formed over the multi-layered reflection film 30 located at the center part of FIG. 5. In this embodiment, the multi-layered reflection film 30 formed by sequentially depositing molybdenum (Mo) and silicon (Si), and the absorption layer 40 capable of including chrome (Cr) shown in FIG. 5 may be the same as those of the embodiment shown in FIG. 1.

In the embodiment shown in FIG. 5, a coating film 15 (or a backside layer) may be formed below the quartz substrate 10, and a blind layer 20*b* is formed between the coating film 15 and the quartz substrate 10. In an embodiment, the coating film 15 may include chromium nitride (CrN), and it may be formed by a sputter method. The blind layer 20*b* may include a nitride film based material as discussed with respect to the blind layer 20*a* of the embodiment of FIG. 4. Preferably, the blind layer 20*b* may include at least one of SiON, TaBON, and CrON. As described above, if the blind layer 20*b* is formed below the quartz substrate 10, the blind layer 20*b* can overcome the problem of exposure light reflecting from the black border (BB) region including no multi-layered reflection film. In other words, since exposure light passing through the quartz substrate 10 is absorbed in the blind layer 20*b*, a phenomenon of light reflecting from either the coating film 15 or a lower part of the quartz substrate 10 can be prevented. In the embodiment shown in FIG. 6, composition of the quartz substrate 10, the multi-layered reflection film 30, and the absorption layer 40 may be the same as those of FIGS. 4 and 5. FIG. 5 shows the multi-layered reflection film 30 formed by sequentially depositing a plurality of silicon (Si) films 32 and a plurality of molybdenum (Mo) films 34. For example, about 40 silicon (Si) films 32 and about 40 molybdenum (Mo) films 34 may be alternately deposited to form the multi-layered reflection film 30. In addition, the absorption layer 40 which may include chromium (Cr) shown in FIG. 6 may be the same as the absorption layer of the embodiment shown in FIG. 1.

Figure 6:
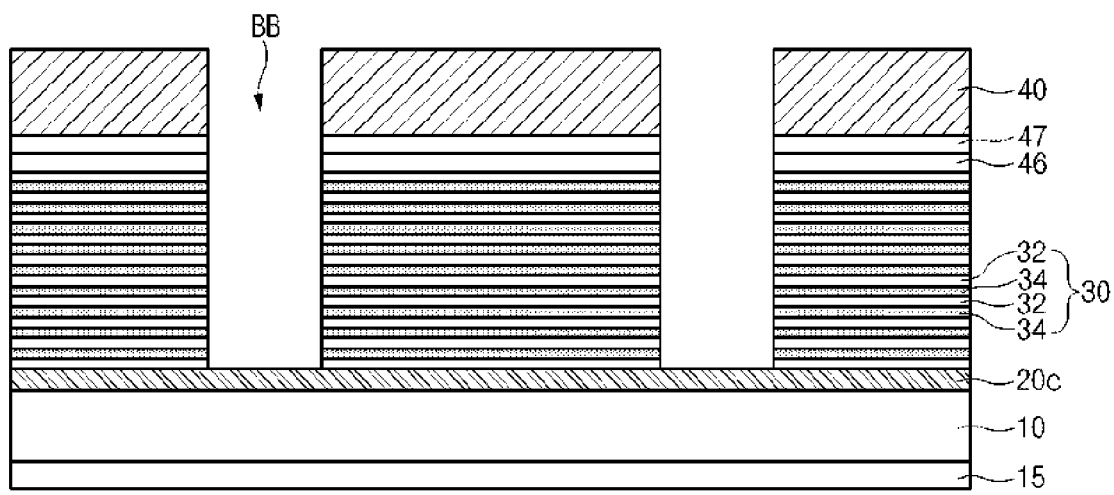

In the embodiment shown in FIG. 6, the blind layer 20*c* is formed between the quartz substrate 10 and the multi-layered reflection film 30. Similar to the embodiments shown in FIGS. 4 and 5, the blind layer 20*c* may include a nitride film. Preferably, the blind layer 20*c* may include at least one of SiON, TaBON, and CrON. As described above, if the blind layer 20*c* is formed over the quartz substrate 10, the blind layer 20*c* may prevent EUV or DUV from being reflected from the black border (BB) region not covered by a multi-layered reflection film. That is, exposure light applied to the BB region is absorbed by the blind layer 20*c* before reaching the quartz substrate 10. Therefore, the EUV mask shown in FIG. 6 can more effectively prevent the exposure light from being reflected from the BB region than the embodiment shown in FIG. 5.

According to the results experiments performed with embodiments of the present invention, the blind layer 20*a*, 20*b*, 20*c* can reduce the reflection rate of DUV to near zero in the absorption layer 40 of the EUV mask formed over the quartz substrate 10, resulting in EUV reflectivity of 0.018% or less.

Figure 8:
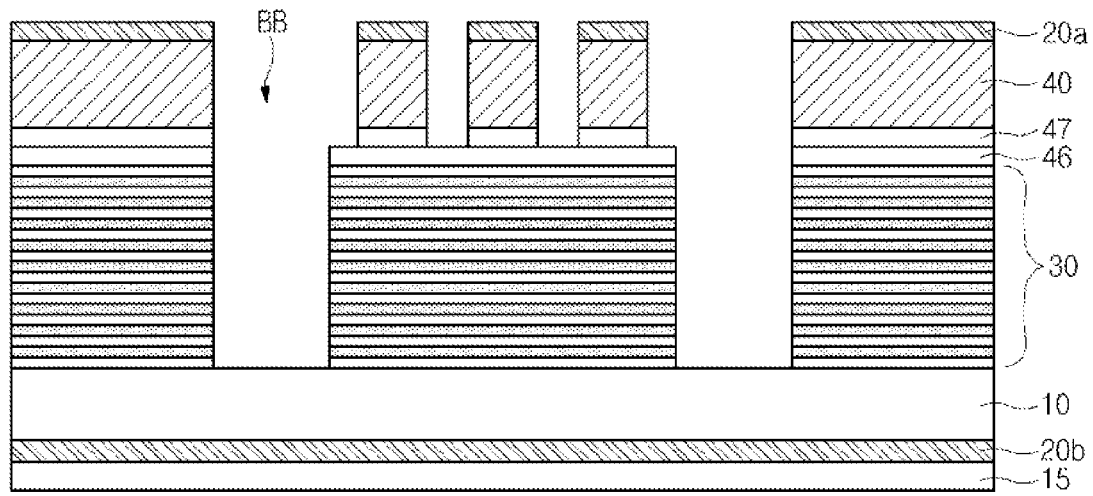
Figure 9:
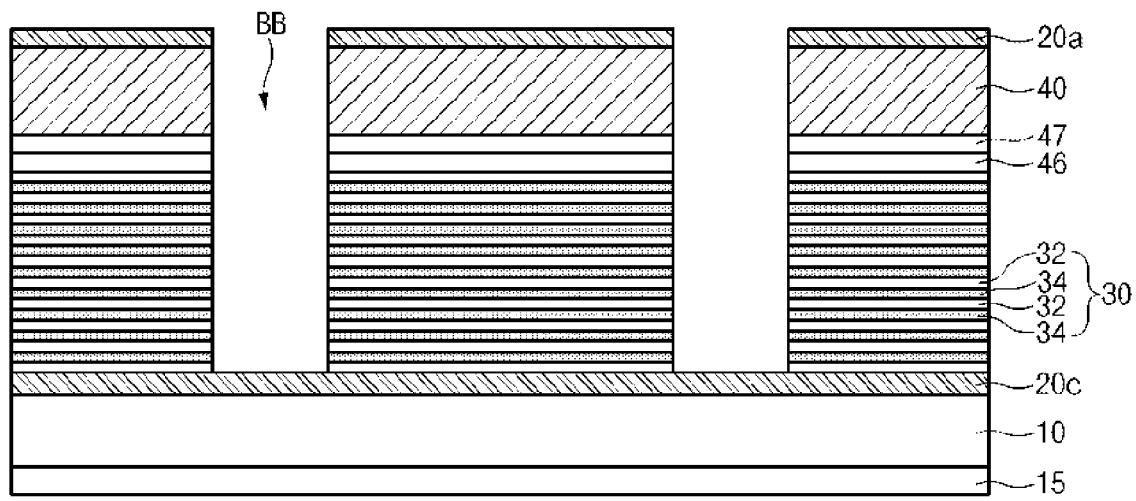
Figure 10:
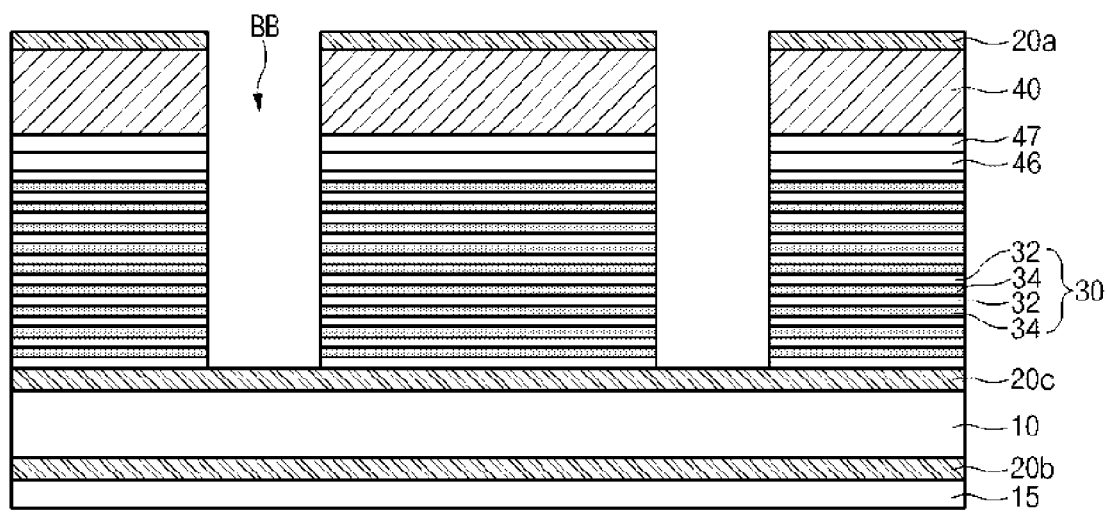

In other embodiments, a combination of the features shown in FIGS. 4 to 6 is possible. For example, an embodiment may include an EUV mask including at least two of a first blind layer ① formed over the absorption layer as seen in FIG. 4, a second blind layer ② formed below the quartz substrate as seen in FIG. 5, and a third blind layer ③ formed over the quartz substrate as seen in FIG. 6. Another embodiment may include both of the first blind layer ① and the second blind layer ② as seen in FIG. 8. Another embodiment may include both of the first blind layer ① and the third blind layer ③ as seen in FIG. 9. Another embodiment may include all of the first blind layer ①, the second blind layer ②, and the third blind layer ③ as seen in FIG. 10.

Figure 7:
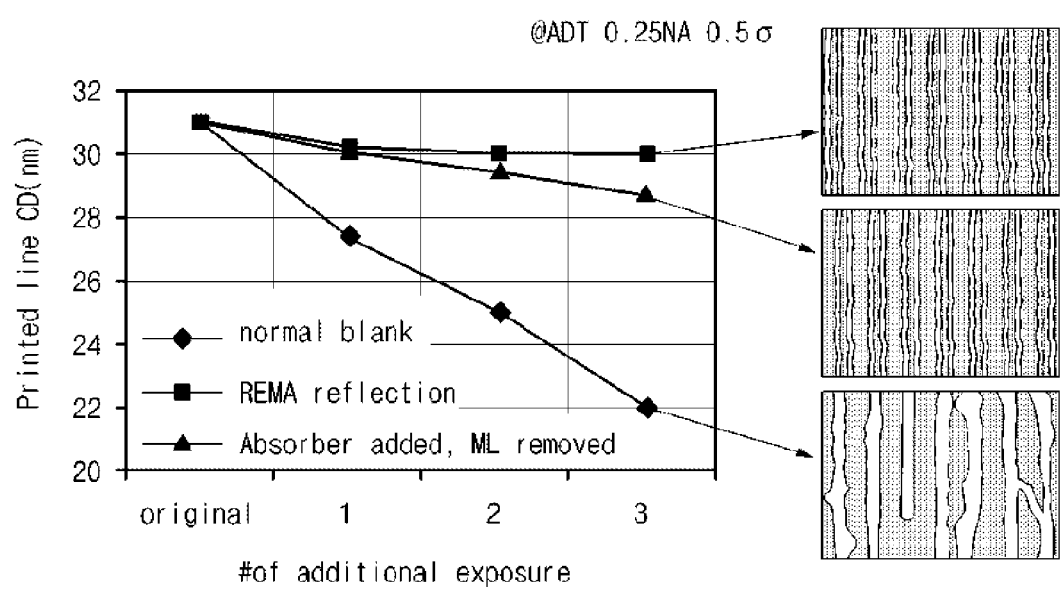
FIG. 7 depicts experimental data illustrating the effects of an EUV mask according to the present invention.

FIG. 7 depicts experimental data illustrating the effects of an EUV mask according to the present invention. Referring to FIG. 7, a line "normal blank" shows data acquired from the embodiment of FIG. 1 in which the blind layer is not used and no additional material is formed over the absorption layer 40. As can be seen from the normal blank of FIG. 7, as the number of additional exposure times is increased by 1 to 3 times, a pattern critical dimension (CD) is gradually reduced. For example, if an initial CD of 31 nm is additionally exposed three times, the initial CD of 31 nm is reduced by 9 nm resulting in a CD of 22 nm, in which causes a defective pattern as seen on the right side of FIG. 7.

In FIG. 7, a line "Absorber added, ML removed" shows data acquired from the embodiment of FIG. 4 in which the multi-layered reflection film 30 is removed from the BB region and the blind layer 20*a* is formed over the absorption layer 40 as seen in FIG. 1. If the number of additional exposure times is 1 to 3, a pattern critical dimension (CD) is reduced by a substantially lesser degree than in the "normal blank" example. For example, if an initial CD of 31 nm is additionally exposed three times for a total of four exposures, an initial CD of 31 nm is reduced by about 2.1 nm resulting in a CD of about 28.9 nm, such that few defective patterns are generated. An improvement relative to the "normal blank" configuration is illustrated by the difference between images shown on the right side of FIG. 7. In FIG. 7, a "REMA reflection" line shows data acquired from the embodiment of FIG. 6 in which the multi-layered reflection film 30 is not present in the BB region and the blind layer 20*b* is formed over the quartz substrate 10. As seen in the figure, when the number of additional exposure times is increased to 1~3 times, a pattern critical dimension (CD) is only reduced by a relatively small amount. After a pattern with an initial CD of 31 nm is exposed three additional times, the initial CD of 31 nm is reduced by about 1 nm to reach about 30 nm, so that significant defects are not created in the pattern (See the images on the right of FIG. 7).

Although experimental data is not shown in the embodiment of FIG. 5 for convenience of description, an intermediary result between the embodiment of FIG. 4 (See the "Absorber added, ML removed" line of FIG. 7) and the embodiment of FIG. 6 (See the "REMA reflection" line of FIG. 7) can be obtained. Therefore, the amount of CD reduction caused by additional exposure is greatly reduced even in the embodiment of FIG. 5, which may reduce or eliminate defective patterns in a 30 nm process.

As is apparent from the above description, the EUV mask according to the present invention can reduce defects associated with shot overlap encountered in wafer exposure. Embodiments may also relate to reflection of unnecessary EUV and DUV generated in a black border region. An EUV system may include at least one of the features disclosed with respect to the above-described embodiments, along with other components and features that are apparent to persons of skill in the art.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. An extreme ultra violet (EUV) mask comprising:
   a quartz substrate;

a black border region formed over the quartz substrate in a shot overlap area;

a multi-layered reflection film formed over the quartz substrate so that a portion of the black border region is exposed;

an absorption layer formed over the multi-layered reflection film; and a first blind layer formed over the absorption layer.

2. The EUV mask according to claim 1, wherein the blind layer includes a nitride film.

3. The EUV mask according to claim 2, wherein the blind layer includes at least one of a silicon oxide nitride (SiON) film, a tantalum boron oxynitride (TaBON) film, and a chromium oxynitride (CrON) film.

4. The EUV mask according to claim 1, wherein the absorption layer includes at least one of chromium (Cr), chromium nitride (CrN), tantalum boron nitride (TaBN), low-reflectivity TaBN (LR-TaBN), and tantalum nitride (TaN).

5. The EUV mask according to claim 1, wherein the multi-layered reflection film includes molybdenum (Mo) and silicon (Si).

6. The EUV mask according to claim 1, wherein the multi-layered reflection film is formed by alternately depositing at least 40 molybdenum (Mo) films and at least 40 silicon (Si) films.

7. The EUV mask according to claim 1, further comprising:
a capping layer located between the absorption layer and the multi-layered reflection film, the capping layer including at least one of a silicon oxide ($SiO_2$) film, a silicon (Si) film, or a ruthenium (Ru) film.

8. The EUV mask according to claim 7, further comprising:
a buffer including a silicon oxide ($SiO_2$) film or a chromium nitride (CrN) film layer formed over the capping layer.

9. The EUV mask of claim 1, further comprising:
a second blind layer disposed over the quartz substrate and under the multi-layered reflection film.

10. The EUV mask of claim 9, further comprising:
a third blind layer disposed under the quartz substrate.

11. An extreme ultra violet (EUV) mask comprising:
a quartz substrate;
a black border region formed over the quartz substrate in a shot overlap area;
a multi-layered reflection film formed over the quartz substrate so that a portion of the black border region is exposed;
an absorption layer formed over the multi-layered reflection film; and
a second blind layer formed over the quartz substrate and under the multi-layered reflection film.

12. The EUV mask of claim 11, further comprising:
a third blind layer disposed under the multi-layered reflection film.

13. The EUV mask of claim 11, wherein the blind layer includes at least one of a silicon oxide nitride (SiON) film, a tantalum boron oxynitride (TaBON) film, and a chromium oxynitride (CrON) film.

14. The EUV mask of claim 11, further comprising:
a coating film disposed under the a second blind layer.

15. The EUV mask of claim 11, further comprising a capping layer disposed over the multi-layer reflection film, and a buffer layer disposed over the capping layer.

16. An extreme ultra violet (EUV) mask comprising:
a quartz substrate;
a black border region formed over the quartz substrate in a shot overlap area;
a multi-layered reflection film formed over the quartz substrate so that a portion of the black border region is exposed;
an absorption layer formed over the multi-layered reflection film; and
a third blind layer formed below the quartz substrate.

17. The EUV mask of claim 16, further comprising:
a first blind layer formed over the absorption layer.

18. The EUV mask of claim 16, wherein the blind layer includes at least one of a silicon oxide nitride (SiON) film, a tantalum boron oxynitride (TaBON) film, and a chromium oxynitride (CrON) film.

19. The EUV mask of claim 16, further comprising:
a coating film disposed under the quartz substrate.

20. The EUV mask of claim 16, further comprising a capping layer disposed over the multi-layer reflection film, and a buffer layer disposed over the capping layer.

* * * * *